United States Patent

[11] 3,617,924

[72] Inventors Hyota Fujita;
Kouichi Irie, both of Amagasaki, Japan
[21] Appl. No. 815,618
[22] Filed Apr. 14, 1969
[45] Patented Nov. 2, 1971
[73] Assignee Mitsubishi Denki Kabushiki Kaisha
Tokyo, Japan
[32] Priority Apr. 17, 1968
[33] Japan
[31] 43/25678

[54] AUTOMATIC FREQUENCY TUNING SYSTEM

4 Claims, 2 Drawing Figs.

[52] U.S. Cl. ........................................................ 331/70, 331/96, 333/22, 333/83

[51] Int. Cl. ........................................................ H03b 5/18

[50] Field of Search ........................................... 331/69, 70, 96; 333/22, 83

*Primary Examiner*—John Kominski
*Attorneys*—Robert E. Burns and Emmanuel J. Lobato

ABSTRACT: An oscillator includes a reference cavity and a load cooled with a cooling water supplied by a single water source for the purpose of controlling an oscillation frequency in accordance with the temperature of the load.

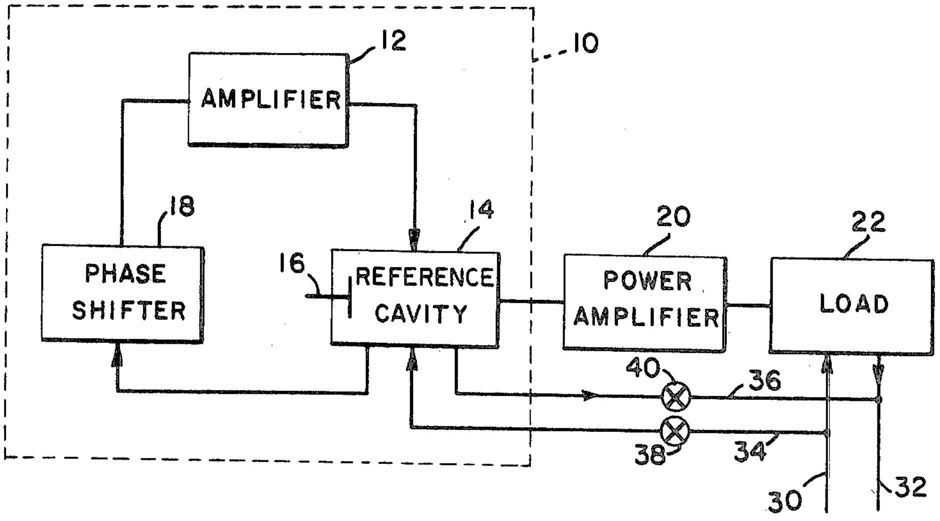

AUTOMATIC FREQUENCY TUNING SYSTEM

BACKGROUND OF THE INVENTION

This invention relates in general to an automatic frequency tuning system, and more particularly to such a system for use with a linear electron accelerator.

In general, frequency tuning systems for use with linear accelerators are required to be operated to supply to the load a microwave power at a constant temperature determined by the temperature of the load. To this end, the conventional type of such frequency tuning systems has comprised means for maintaining the temperature of the load at a predetermined magnitude while keeping a constant temperature of a reference cavity operatively coupled to an oscillator involved to determined the oscillation frequency. Alternatively the reference cavity has been formed of any suitable material low in temperature coefficient with respect to frequency to oscillate the oscillator at the required constant frequency. This has resulted in a disadvantage that cooling means for maintaining the constant temperature of the load is necessarily provided besides cooling means for maintaining the constant temperature of the reference cavity for keeping the oscillation frequency of the oscillator at a predetermined constant magnitude.

SUMMARY OF THE INVENTION

Accordingly it is an object of the invention to provide a frequency tuning system including improved cooling means for cooling an oscillator and a load involved in simple manner while permitting the system to be automatically operated.

Briefly, the invention accomplishes this object by the provision of an automatic frequency tuning system comprising an oscillator including a reference cavity, and a load driven at an oscillation frequency provided from the oscillator, characterized by a cooling line for supplying a fluid coolant from a common cooling source to both the reference cavity and the load whereby the oscillation frequency is controlled in accordance with the temperature of the load.

Preferably, the cooling line may be arranged such that the fluid coolant flows in series or parallel circuit relationship into both the reference cavity and the load.

BRIEF DESCRIPTION OF THE DRAWING

The invention will become more readily apparent from the following detailed description taken in conjunction with the accompanying drawing in which.

DESCRIPTION OF THE PREFERRED EMBODIMENT

Figure 1:
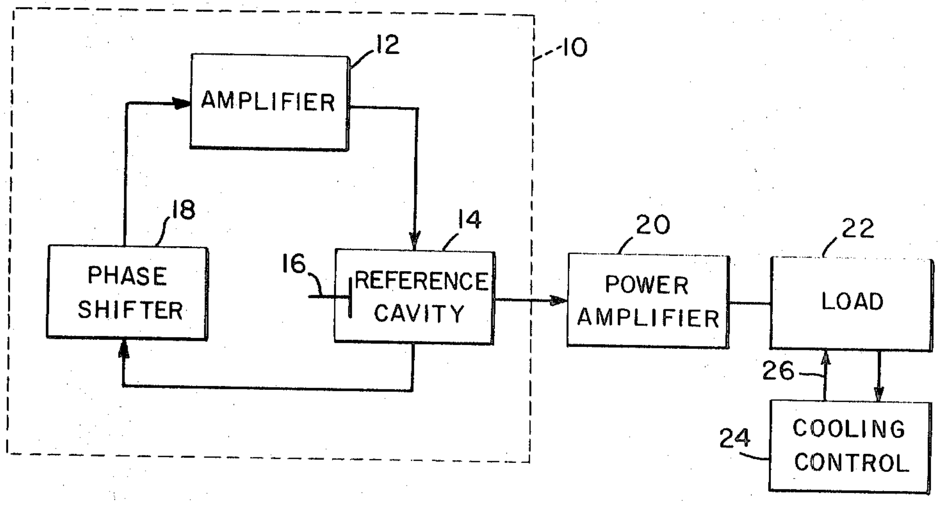
FIG. 1 PRIOR ART
FIG. 1 is a block diagram of a frequency tuning system for use with a linear electron accelerator constructed in accordance with the principles of the prior art.

Referring now to the drawing and FIG. 1 in particular, there is illustrated a frequency tuning system for use with a linear electron accelerator constructed in accordance with the principles of the prior art. The arrangement illustrated comprises an oscillator device generally designated by the reference numeral 10 and including an amplifier 12, and a reference cavity 14 having applied thereto an output from the amplifier 12 and having a frequency control 16 for varying a resonance frequency to which the cavity 14 is tuned to be resonated. One portion of the reference cavity 14 is fed back to the amplifier 12 through a phase shifter 18. That is, it is suitably shifted in phase angle and applied to the amplifier 12 resulting in the oscillation of the oscillator device 10. The other portion of the output from the reference cavity 14 is applied, as an oscillatory output from the oscillator device 10 to a power amplifier 20 which is, in turn, electrically connnected to a load 22. Then the load 22 is fluidly connected to a cooling device 24 through a conduit designated by a pair of arrows 26 to be continuously supplied with any suitable fluid coolant such as cooling water from the cooling device 24 whereby it is controlled to and maintained at a predetermined constant temperature.

As previously described, frequency tuning systems for use with linear electron accelerators are required to be operated to supply to the load such as the load 22 a microwave power having a constant frequency determined by the temperature of the load. In the arrangement illustrated, therefore, the load 22 has been maintained at a predetermined constant temperature as above-described while at the same time the oscillator device 10 has provided the required constant oscillation frequency either by maintaining the corresponding constant temperature of the reference cavity 14 serving to determine the oscillation frequency, or by forming the reference cavity of any suitable material low in temperature coefficient with respect to frequency. This measure has resulted in a disadvantage that, in addition to the cooling device 24 for maintaining the constant temperature of the load 22, means should be provided for maintaining a constant temperature of the reference cavity 14 in order to hold the constant oscillation frequency provided by the oscillator device 10.

The invention contemplates to eliminate this disadvantage through automatic control of the oscillation frequency to a frequency required for the load without the load controlled in temperature.

Figure 2:
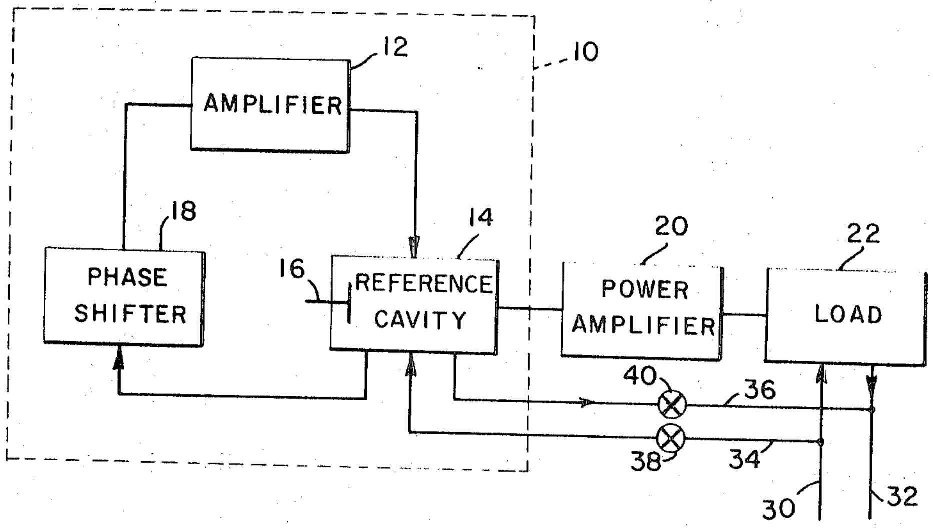
FIG. 2 is a block diagram of an automatic frequency tuning system for use with a linear electron accelerator constructed in accordance with the principles of the invention.

Referring now to FIG. 2 wherein like reference numerals designate the corresponding components, it is seen that the arrangement illustrated is different from that shown in FIG. 1 only in coding means. More specifically, the cooling device 24 as shown in FIG. 1 is omitted while a coolant conduit 30 supplies any suitably fluid coolant such as cooling water from a coolant source (not shown) to the load 22 and a return coolant conduit 32 is provided for returning the coolant back. A cooling conduit 34 branched from the conduit 30 is operatively connected to the reference cavity 14 and a return coolant conduit 36 from the cavity 14 is connected to the return conduit 32. The conduits 34 and 36 are preferably provided with a pair of adjusting valves 38 and 40 respectively to control a flow rate of the coolant to the reference cavity 14.

With the arrangement illustrated it will be appreciated that a portion of the fluid coolant from the source (not shown) flows into the load 22 to cool the latter while at the same time the remaining portion of the coolant flows into the reference cavity 14 to cool it. This measure permits the oscillator device 10 to provide an oscillation frequency automatically controlled in accordance with the temperature of the load.

It is now assumed that the load 22 is the same in temperature coefficient with respect to frequency as the reference cavity 14. That is, the load and the cavity has a common magnitude of df/dT where $f$ represents a frequency and T represents a temperature. Under the assumed condition, a change in temperature $\Delta T$ of the load 22 causes the reference cavity 14 to change in temperature by the same amount or $\Delta T$ provided that a common cooling source supplies the coolant to both the load and the cavity. This is true in the case of a variation in frequency $\Delta f$. Thus it will be appreciated that even if the coolant changes in temperature, the oscillation frequency provided by the oscillator device 10 is caused to be maintained at a frequency required for the load 22.

If the load 22 is different in temperature coefficient with respect to frequency from the reference cavity 22 then the adjusting valves 38 and 40 can be operated to control a rate at which the coolant flows into the cavity 14 for the purpose of compensating for the difference in temperature coefficient with respect to frequency or df/dt between the load and the cavity where $t$ represent time.

While the invention has been described in terms of the load being fluidly connected in parallel to the reference cavity it is to be understood that with satisfactory results, the load may be fluidly connected in series to the cavity provided that the causation will be taken to the fact that the coolant leaving the load increases in temperature due to a change in conditions for use. Further, if desired the adjusting valves 38 and 48 may be disposed on the conduits 30 and 32 rather than on the conduits 34 and 36 for the purpose of controlling a quantity of coolant flowing into the load.

From the foregoing it will be appreciated that the invention has provided an automatic frequency tuning system capable of controllably maintaining an oscillation frequency of an oscillator device at a frequency required for the associated load only through the use of a source of fluid coolant without the necessity of providing any cooling device with a temperature control.

What we claim is:

1. In an automatic frequency tuning system, the combination of an oscillator device including a reference cavity, a load driven at an oscillation frequency provided by said oscillation device, and a cooling line for supplying a fluid coolant from a common cooling source to both said reference cavity and said load whereby said oscillation frequency is controlled in accordance with the temperature of the load.

2. An automatic frequency tuning system as claimed in claim 1, wherein said cooling line is arranged such that the fluid coolant flows in parallel circuit relationship into both said reference cavity and said load.

3. An automatic frequency tuning system as claimed in claim 1, wherein said cooling line is arranged such that said fluid coolant flows in parallel circuit relationship into both said reference cavity and said load.

4. An automatic frequency tuning system as claimed in claim 1, wherein said cooling line is provided with adjusting valve means for adjusting a flow rate of the fluid coolant.

* * * * *